US009530908B2

(12) United States Patent
Chang et al.

(10) Patent No.: US 9,530,908 B2
(45) Date of Patent: Dec. 27, 2016

(54) HYBRID VAPOR PHASE-SOLUTION PHASE GROWTH TECHNIQUES FOR IMPROVED CZT(S,SE) PHOTOVOLTAIC DEVICE PERFORMANCE

(71) Applicant: International Business Machines Corporation, Armonk, NY (US)

(72) Inventors: Liang-Yi Chang, White Plains, NY (US); Talia S. Gershon, White Plains, NY (US); Richard A. Haight, Mahopac, NY (US); Yun Seog Lee, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/540,986

(22) Filed: Nov. 13, 2014

(65) Prior Publication Data

US 2016/0141434 A1    May 19, 2016

(51) Int. Cl.
| | |
|---|---|
| *B05D 5/12* | (2006.01) |
| *H01L 31/032* | (2006.01) |
| *H01L 31/0749* | (2012.01) |
| *H01L 31/18* | (2006.01) |
| *H01L 31/0224* | (2006.01) |

(52) U.S. Cl.
CPC ... *H01L 31/0326* (2013.01); *H01L 31/022466* (2013.01); *H01L 31/0749* (2013.01); *H01L 31/1864* (2013.01)

(58) Field of Classification Search
USPC .......................................................... 427/74
See application file for complete search history.

(56) References Cited

U.S. PATENT DOCUMENTS

| | | | |
|---|---|---|---|
| 6,162,300 | A | 12/2000 | Bichrt |
| 8,426,241 | B2 | 4/2013 | Ahmed et al. |
| 8,765,518 | B1 | 7/2014 | Todorov |
| 2011/0094557 | A1 | 4/2011 | Mitzi et al. |

(Continued)

OTHER PUBLICATIONS

Nagaoka et al., "Effects of sodium on electrical properties in Cu2ZnSnS4 single crystal," Applied Physics Letters 104, 152101 (Apr. 2014).

(Continued)

*Primary Examiner* — Austin Murata
(74) *Attorney, Agent, or Firm* — Vazken Alexanian; Michael J. Chang, LLC

(57) ABSTRACT

A hybrid vapor phase-solution phase CZT(S,Se) growth technique is provided. In one aspect, a method of forming a kesterite absorber material on a substrate includes the steps of: depositing a layer of a first kesterite material on the substrate using a vapor phase deposition process, wherein the first kesterite material includes Cu, Zn, Sn, and at least one of S and Se; annealing the first kesterite material to crystallize the first kesterite material; and depositing a layer of a second kesterite material on a side of the first kesterite material opposite the substrate using a solution phase deposition process, wherein the second kesterite material includes Cu, Zn, Sn, and at least one of S and Se, wherein the first kesterite material and the second kesterite material form a multi-layer stack of the absorber material on the substrate. A photovoltaic device and method of formation thereof are also provided.

16 Claims, 5 Drawing Sheets

(56) References Cited

U.S. PATENT DOCUMENTS

| | | | |
|---|---|---|---|
| 2011/0232758 A1 | 9/2011 | Khanarian et al. | |
| 2012/0279565 A1 | 11/2012 | Mitzi et al. | |
| 2012/0318335 A1 | 12/2012 | Abou-kandil et al. | |
| 2013/0037090 A1 | 2/2013 | Bag et al. | |
| 2013/0037111 A1 | 2/2013 | Mitzi et al. | |
| 2013/0074911 A1* | 3/2013 | Liao | H01L 31/0326 136/255 |
| 2013/0269764 A1 | 10/2013 | Barkhouse et al. | |
| 2013/0316519 A1* | 11/2013 | Mitzi | H01L 21/02422 438/478 |
| 2014/0053896 A1 | 2/2014 | Jost et al. | |
| 2014/0096826 A1 | 4/2014 | Todorov | |
| 2014/0338736 A1* | 11/2014 | Yun | H01L 31/0326 136/255 |
| 2015/0087106 A1* | 3/2015 | Beck | H01L 31/02008 438/72 |

OTHER PUBLICATIONS

D.B. Mitzi et al., "The path towards a high-performance solution-processed kesterite solar cell," Solar Energy Materials and Solar Cells, vol. 95, No. 6, Jun. 2011, pp. 1421-1436.

W. Wang et al., "Device Characteristics of CZTSSe Thin—Film Solar Cells with 12.6% Efficiency," Advanced Energy Materials, vol. 4, No. 7, Nov. 2013.

J. Zhong et al., "Sulfurization induced surface constitution and its correlation to the performance of solution-processed Cu2ZnSn(S,Se)4 solar cells," Scientific Reports, vol. 4, (Sep. 2014), 6288.

\* cited by examiner

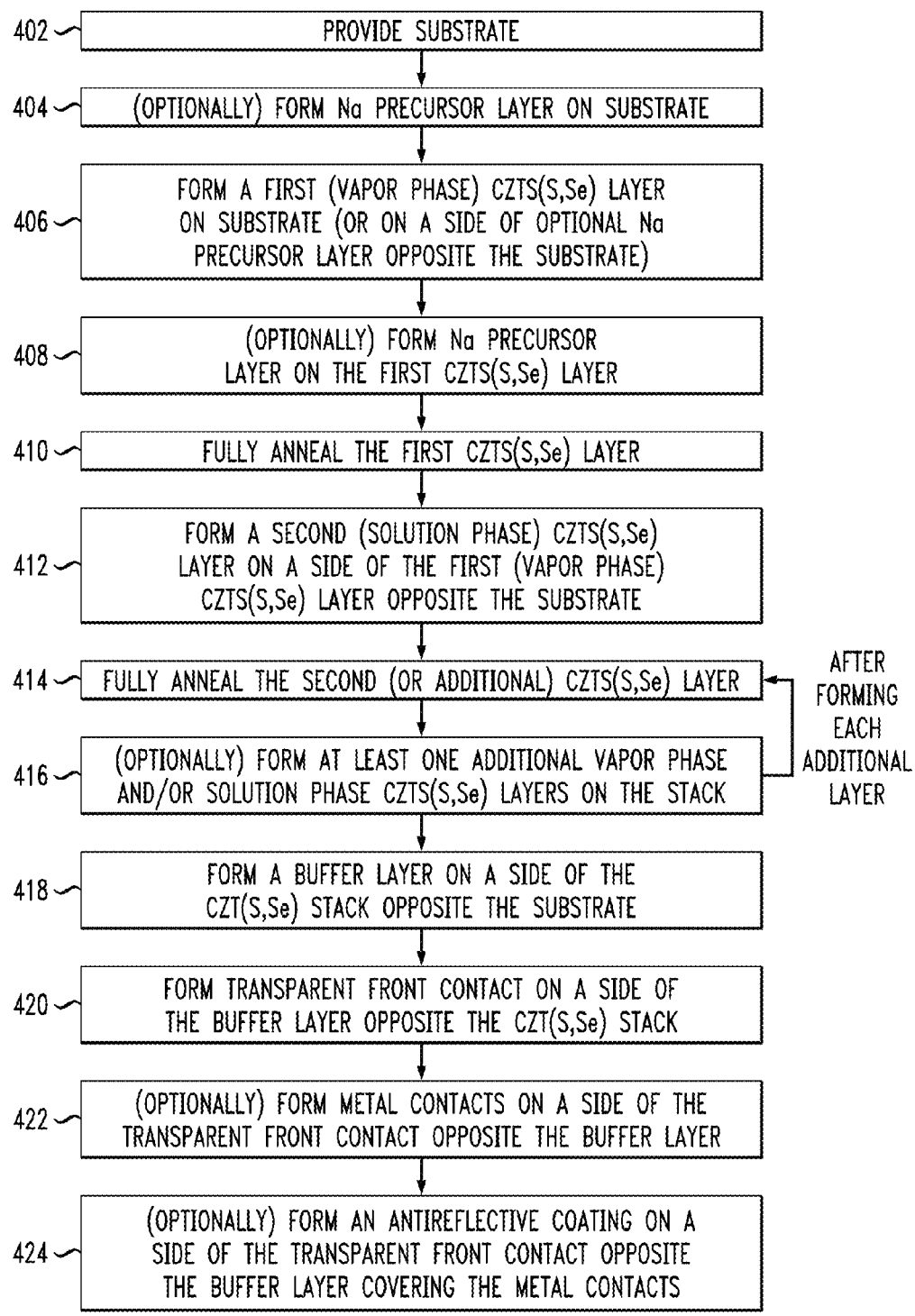

US 9,530,908 B2

HYBRID VAPOR PHASE-SOLUTION PHASE GROWTH TECHNIQUES FOR IMPROVED CZT(S,SE) PHOTOVOLTAIC DEVICE PERFORMANCE

STATEMENT OF GOVERNMENT RIGHTS

This invention was made with Government support under Contract number DE-EE-0006334 awarded by Department of Energy. The Government has certain rights in this invention.

FIELD OF THE INVENTION

The present invention relates to CZT(S,Se)-based photovoltaic devices and more particularly, to a hybrid vapor phase-solution phase CZT(S,Se) growth technique.

BACKGROUND OF THE INVENTION

CZT(S,Se) is an earth abundant, light absorbing material presently being used in photovoltaic devices. The highest efficiency photovoltaic devices have been achieved via growth of the absorber by solution deposition with the elemental constituents being dissolved in hydrazine. See, for example, U.S. Patent Application Publication Number 2013/0037090 filed by Bag et al., entitled "Capping Layers for Improved Crystallization." CZT(S,Se)-based photovoltaic devices have been produced with efficiencies above 12% but these devices unfortunately suffer from point defects (crystallographic defects) which limit increases in open circuit voltage (Voc).

One approach to increasing Voc involves the use of high work function back contact materials to replace the standard molybdenum (Mo) metal contact. See, for example, U.S. Patent Application Publication Number 2013/0269764 filed by Barkhouse et al., entitled "Back Contact Work Function Modification for Increasing CZTSSe Thin Film Photovoltaic Efficiency" (hereinafter "U.S. Patent Application Publication Number 2013/0269764"). However, while the standard device thickness is generally about 2 micrometers (μm), contact engineering to achieve increases in Voc works only if the thickness of the CZTSSe absorber is reduced to below 1 μm. This critical dimension is determined by the sum of the back and front depletion widths and minority carrier diffusion length. See, for example, U.S. Patent Application Publication Number 2013/0269764. Above this value the device will not show improvement in Voc.

While sub-micron films can be fabricated with solution phase techniques, the resulting films suffer from pinholes. Pinholes are undesirable since they can lead to electrical shorting of the device when conductive contacts are added. Additionally, electron blocking layers or hole transport layers (often oxides) have been adopted in thin film solar cells for improved rectifying behavior and Voc. Oxides, however, get reduced by the hydrazine used in solution phase deposition, which is undesirable.

Therefore, techniques for forming high efficiency, defect-free CZTS(S,Se) absorber photovoltaic devices would be desirable.

SUMMARY OF THE INVENTION

The present invention provides a hybrid vapor phase-solution phase CZT(S,Se) growth technique. In one aspect of the invention, a method of forming a kesterite absorber material on a substrate is provided. The method includes the steps of: depositing a layer of a first kesterite material on the substrate using a vapor phase deposition process, wherein the first kesterite material includes copper (Cu), zinc (Zn), tin (Sn), and at least one of sulfur (S) and selenium (Se); annealing the first kesterite material to crystallize the first kesterite material; and depositing a layer of a second kesterite material on a side of the first kesterite material opposite the substrate using a solution phase deposition process, wherein the second kesterite material includes Cu, Zn, Sn, and at least one of S and Se, wherein the first kesterite material and the second kesterite material form a multi-layer stack of the absorber material on the substrate.

In another aspect of the invention, a method of forming a photovoltaic device is provided. The method includes the steps of: depositing a layer of a first kesterite material on a substrate using a vapor phase deposition process, wherein the first kesterite material includes Cu, Zn, Sn, and at least one of S and Se; annealing the first kesterite material to crystallize the first kesterite material; depositing a layer of a second kesterite material on a side of the first kesterite material opposite the substrate using a solution phase deposition process, wherein the second kesterite material includes Cu, Zn, Sn, and at least one of S and Se, and wherein the first kesterite material and the second kesterite material form a multi-layer stack of an absorber material on the substrate; forming a buffer layer on a side of the multi-layer stack of the absorber material opposite the substrate; and forming a transparent front contact on a side of the buffer layer opposite the multi-layer stack of the absorber material.

In yet another aspect of the invention, a photovoltaic device is provided. The photovoltaic device includes a substrate; a layer of a first kesterite material on the substrate, wherein the first kesterite material includes Cu, Zn, Sn, and at least one of S and Se; a layer of a second kesterite material on a side of the first kesterite material opposite the substrate, wherein the second kesterite material includes Cu, Zn, Sn, and at least one of S and Se, and wherein the first kesterite material and the second kesterite material form a multi-layer stack of an absorber material on the substrate; a buffer layer on a side of the multi-layer stack of the absorber material opposite the substrate; and a transparent front contact on a side of the buffer layer opposite the multi-layer stack of the absorber material.

A more complete understanding of the present invention, as well as further features and advantages of the present invention, will be obtained by reference to the following detailed description and drawings.

BRIEF DESCRIPTION OF THE DRAWINGS

FIG. 4 is a diagram illustrating an exemplary methodology for forming a photovoltaic device using the present hybrid vapor phase-solution phase growth process for CZTS (S,Se) according to an embodiment of the present invention;

DETAILED DESCRIPTION OF PREFERRED EMBODIMENTS

Figure 1:
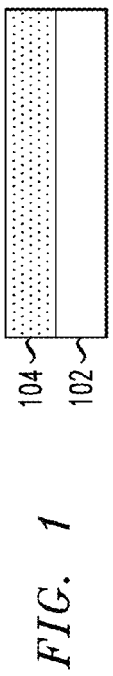
FIG. 1 is a cross-sectional diagram illustrating an exemplary starting structure for a hybrid vapor phase-solution phase growth process for CZTS(S,Se) including a first (vapor phase) CZTS(S,Se) layer formed on a substrate according to an embodiment of the present invention.

As provided above, while CZT(S,Se)-based photovoltaic devices have been produced with efficiencies at or above 12% using solution phase techniques, defects in the resulting film such as pinholes can lead to shorting of the device when conductive contacts are added. Vapor deposition can be used to produce pinhole-free CZT(S,Se) films. However, the resulting devices have efficiencies well below that achieved with solution phase processing.

As also provided above, it may be desirable to employ electron blocking layers or hole transport layers for improved rectifying behavior and open circuit voltage (Voc). However, these hole transport materials are often formed from oxides such as tungsten trioxide ($WO_3$), nickel oxide (NiO), or molybdenum trioxide ($MoO_3$). All of these materials are easily (undesirably) reduced by hydrazine which is commonly employed in solution phase deposition.

Advantageously, provided herein are hybrid vapor phase-solution phase CZT(S,Se) deposition techniques that remedy the above-described problems thereby permitting the fabrication of high-efficiency CZT(S,Se)-based photovoltaic devices. Namely, as will be described in detail below, the present hybrid approach first leverages the benefits of a vapor phase CZT(S,Se) process to produce a pinhole-free film. A vapor phase process does not involve solvents such as hydrazine, thus avoiding any undesirable effects on underlying oxide materials.

The vapor phase CZT(S,Se) further acts as a barrier layer to protect any underlying oxide layers during a subsequent solution phase CZT(S,Se) process, thus preserving the functionality of the oxide layers. Thus, a variety of materials (including oxides such as indium-tin-oxide (ITO), fluorinated tin oxide (FTO), etc.—see below) can be used as substrates for device fabrication in accordance with the present techniques. This would not be possible with a purely solution based CZT(S,Se) approach involving hydrazine.

Additionally, the morphology at the interface between CZT(S,Se) and the back contact (e.g., molybdenum (Mo)) can be especially important in thin devices as more carriers are generated in this region. Vapor deposited CZT(S,Se) is void-free at this interface. Thus, according to the present hybrid deposition approach, a void-free interface can be formed at the back contact.

The present hybrid approach next leverages the benefits of a solution phase CZTS(S,Se) process to produce a high-efficiency film. As provided above, solution deposition techniques for CZTS(S,Se) can produce devices with efficiencies at (or exceeding) 12%.

The term "CZT(S,Se)," as used herein, refers to a kesterite material containing copper (Cu), zinc (Zn), tin (Sn), and at least one of sulfur (S) and selenium (Se). Thus, the designation (S,Se) indicates that S and/or Se is present in the material.

A general description of the present hybrid vapor phase-solution phase growth process for CZT(S,Se) is now provided. An exemplary implementation of the present techniques in the fabrication of a photovoltaic device will be provided below.

Referring to FIG. 1, the starting platform for the process is a substrate 102. A variety of different substrates and substrate configurations are possible in accordance with the present techniques. It is to be understood that while FIG. 1 generically depicts substrate 102 as a single layer, the substrate may in fact be formed from (e.g., a stack of) multiple layers. By way of example only, substrate 102 may include a conductive layer(s) coated on a transparent substrate. Conductive transparent substrate configurations are suited for photovoltaic device applications. For instance, according to an exemplary embodiment, substrate 102 is Mo-coated (soda lime) glass. According to another exemplary embodiment, substrate 102 is zinc oxide (ZnO), zinc oxysulfate (ZnOS) and/or zinc tin oxide (ZnSnO)-coated ITO or FTO.

As noted above, with conventional processes that solely use solution phase CZT(S,Se) deposition techniques with hydrazine as the solvent, degradation of oxide materials is inevitable. Advantageously, with the present techniques, the vapor phase CZT(S,Se) will act as a barrier layer to protect the underlying oxide material(s) during subsequent steps—thus making a greater variety of different substrate configurations possible.

Next as shown in FIG. 1, a CZT(S,Se) layer 104 is formed on the substrate 102 using vapor phase deposition. As will be described in detail below, the CZT(S,Se) will, according to an exemplary embodiment, be formed as a multi (e.g., two, three, etc.)-layered stack wherein a first one of the CZT(S,Se) layers (e.g., CZT(S,Se) layer 104) is formed using a vapor deposition techniques and a second one of the CZT(S,Se) layers is formed on the first CZT(S,Se) layer using a solution phase deposition technique. Thus, the first layer formed on the substrate (e.g., CZT(S,Se) layer 104)

may also be referred to herein as the first CZT(S,Se) material/layer and the second layer formed on the first layer may also be referred to herein as the second CZT(S,Se) material/layer. Further, embodiments are also presented herein where one or more additional CZT(S,Se) layers are formed on the stack. Accordingly, these additional CZT(S,Se) layers may also be referred to herein as the third, fourth, etc. CZT(S,Se) materials/layers.

According to an exemplary embodiment, the vapor phase deposition of CZT(S,Se) layer 104 includes contacting the substrate with a source of Cu, a source of Zn, a source of Sn, and at least one of a source of S and a source of Se under conditions (e.g., temperature, pressure, duration, etc.) sufficient to form CZT(S,Se) layer 104 on the substrate 102. According to an exemplary embodiment, the conditions include a temperature of from about 400 degrees Celsius (° C.) to about 450° C., and ranges therebetween, and a pressure of from about $1 \times 10^{-11}$ torr to about $1 \times 10^{-3}$ torr, and ranges therebetween.

By way of example only, the formation of CZT(S,Se) layer 104 may be carried out in a vapor deposition system contained within a vacuum chamber wherein, for instance, the substrate 102 is placed on a hot plate within the vacuum chamber and heated to a temperature of from about 400° C. to about 450° C., and ranges therebetween. The source materials for CZT(S,Se) layer 104 might simply be placed in crucibles within the vacuum chamber. However, in order to precisely control the fluxes of the Cu, Zn, Sn, S and/or Se, elemental sources of each these components are preferably contained in separate effusion cells connected to the vacuum chamber that can be independently heated to control the flux. Suitable effusion cells for use in accordance with the present techniques are described, for example, in U.S. Pat. No. 6,162,300 issued to Bichrt, entitled "Effusion Cell" (hereinafter "U.S. Pat. No. 6,162,300"), the contents of which are incorporated by reference as if fully set forth herein. As described in U.S. Pat. No. 6,162,300, the flux from the effusion cells can be controlled by varying the temperature of the effusion cell and/or by employing a control valve between the effusion cell and the growth chamber.

According to an exemplary embodiment, the CZT(S,Se) layer 104 is deposited on the substrate 102 to a thickness of from about 50 nanometers (nm) to about 300 nm, and ranges therebetween, e.g., from about 100 nm to about 300 nm, and ranges therebetween. By way of example only, the above-described vapor phase deposition process can be carried out for a duration sufficient to achieve a continuous layer having a thickness in this range, wherein the duration can be anywhere from about 5 minutes to about 300 minutes, and ranges therebetween.

Following deposition, CZT(S,Se) layer 104 is then subjected to a high temperature anneal to generate a polycrystalline material with large grain sizes. According to an exemplary embodiment, this annealing to fully crystallize the CZT(S,Se) layer 104 is performed at a temperature of greater than about 500° C., e.g., from about 550° C. to about 650° C., and ranges therebetween. This will yield a CZT(S,Se) material having grains with an average grain size of from about 1 micrometer (µm) to about 2 µm, and ranges therebetween. By way of example only, grain size is measured herein as the longest length dimension of the grain in cross-section. As will be described in detail below, fully annealing the CZT(S,Se) layer 104 in this manner is needed to prevent damaging the CZT(S,Se) layer 104 during the solution deposition phase of the process since the solvents used in the solutions can dissolve non-crystalline forms of the material. Full crystallization refers to the maximum grain size achievable in the thin film. Vertically, grain size is limited to the film thickness (the grains in the vertical dimension will grow no larger than the film thickness). Laterally, however, grain size is dictated by the kinetics of grain boundary formation. When fully crystallized, each grain is crystalline, i.e., X-ray diffraction shows characteristic lines whose widths are representative of the size of the grains. Once grains achieve these dimensions (e.g., a grain size of from about 1 µm to about 2 µm, and ranges therebetween—measured as the longest length dimension of the grain in cross-section), no further coarsening is observed (the grains do not get larger) and so the film is then fully crystallized.

An advantage of a vapor phase deposition process is that the resulting CZT(S,Se) is pinhole-free. As noted above, pinholes are an inevitable result of solution phase CZT(S,Se) deposition and can undesirably lead to shorting when contacts are formed on the device (especially in the case of devices having thin absorber layers). By employing the present two-layered stack configuration, the vapor phase CZT(S,Se) layer 104 first formed in the stack is thus pinhole-free.

As also provided above, the vapor phase CZT(S,Se) acts as a barrier layer to protect underlying oxide materials during subsequent processing steps. Specifically, forming the second layer in the two-layered stack will involve a solution phase deposition process that might include the use of hydrazine which can undesirably reduce the underlying oxide materials. Thus, as shown in FIG. 1, it is desirable to form the (vapor phase) CZT(S,Se) layer 104 as a continuous layer that fully covers and protects the substrate 102 (i.e., so as to protect oxide materials, if any, present in the substrate).

Optionally, the CZT(S,Se) layer 104 is doped with sodium (Na). Na doping can serve to both coarsen/enlarge the size of the individual crystal grains, and assist in passivating the grain boundaries so as to increase device efficiency. See, for example, Nagaoka et al., "Effects of sodium on electrical properties in $Cu_2ZnSnS_4$ single crystal," Applied Physics Letters 104, 152101 (April 2014) (hereinafter "Nagaoka"), the contents of which are incorporated by reference as if fully set forth herein. Nagaoka describes the effects of Na diffusion on CZTS grain size. Further, according to Nagaoka, there is an enhancement in the unit-cell size of the CZTS with increases in the Na concentration—based on Na being a substitutional impurity in CZTS since the radius of the Na atom is greater than that of cations in CZTS. Also, the hole mobility of the CZTS is enhanced with increasing Na concentration.

Figure 6A:
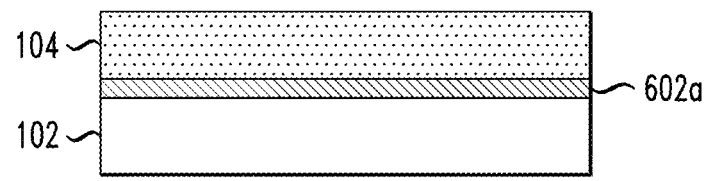
FIG. 6A is a cross-sectional diagram illustrating use of an optional sodium (Na) precursor layer between the substrate and the vapor phase CZTS(S,Se) layer for doping the CZTS(S,Se) layer according to an embodiment of the present invention.

According to an exemplary embodiment, Na doping of the CZT(S,Se) layer 104 is performed by placing a Na precursor layer on the bottom (see FIG. 6A) or on the top (see FIG. 6B) of the CZT(S,Se) layer 104. When the high temperature crystallizing anneal of CZT(S,Se) layer 104 is performed, Na ions from the precursor layer diffuse into and dope the CZT(S,Se) layer 104. According to an exemplary embodiment, the Na precursor layer is a layer of sodium fluoride (NaF). Referring briefly to FIG. 6A, this figure illustrates the optional step of placing a Na precursor layer 602a between the substrate 102 and the CZTS(S,Se) layer 104. According to an exemplary embodiment, the Na precursor layer 602a (e.g., a NaF layer) is first deposited onto the substrate 102 using a deposition process such as chemical vapor deposition (CVD). The substrate 102 with the Na precursor layer 602a formed thereon can then be transferred to the vapor deposition system and the CZTS(S,Se) layer 104 can be formed on a side of the Na precursor layer 602a opposite the substrate using the above-described process.

Na ions from the Na precursor layer 602a diffuse into the CZTS(S,Se) layer 104 during the high temperature anneal (used to generate a polycrystalline material with large grain sizes—see above). The amount/concentration of the Na dopant into the CZTS(S,Se) layer 104 can be controlled, for example, based on the thickness of the Na precursor layer 602a—with a thicker Na precursor layer 602a contributing to a greater amount of the Na dopant, and vice versa. One skilled in the art, given the instant description of the present techniques, would be able to tailor the thickness of the Na precursor layer 602a for a desired Na dopant concentration. Once the Na ion diffusion via the high temperature anneal has taken place, the Na precursor layer is no longer present.

Figure 6B:
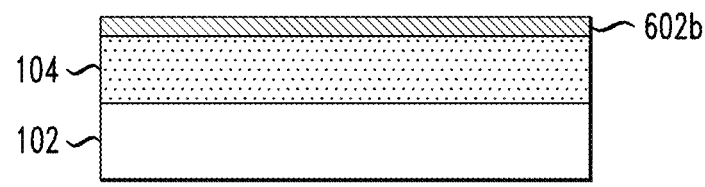
FIG. 6B is a cross-sectional diagram illustrating an alternative embodiment wherein the optional Na precursor layer is placed on top of the vapor phase CZTS(S,Se) layer according to an embodiment of the present invention.

Alternatively, FIG. 6B illustrates the optional step of placing a Na precursor layer 602b on top of the CZTS(S,Se) layer 104. As shown in FIG. 6B, once the CZTS(S,Se) layer 104 is formed on the substrate 102 as described above, the Na precursor layer 602b (e.g., a NaF layer) can then be formed (e.g., via CVD) on a side of the CZTS(S,Se) layer 104 opposite the substrate 102.

Na ions from the Na precursor layer 602b diffuse into the CZTS(S,Se) layer 104 during the high temperature anneal (see above). The amount/concentration of the Na dopant into the CZTS(S,Se) layer 104 can be controlled, for example, based on the thickness of the Na precursor layer 602b—with a thicker Na precursor layer 602b contributing to a greater amount of the Na dopant, and vice versa. One skilled in the art, given the instant description of the present techniques, would be able to tailor the thickness of the Na precursor layer 602b for a desired Na dopant concentration. Once the Na ion diffusion via the high temperature anneal has taken place, the Na precursor layer is no longer present.

Figure 2:
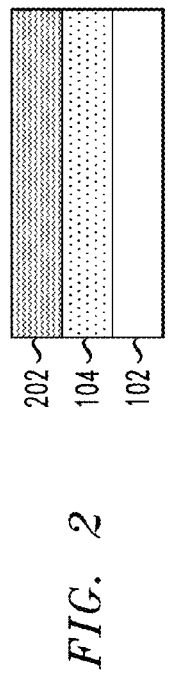
FIG. 2 is a cross-sectional diagram illustrating a second (solution phase) CZTS(S,Se) layer having been formed on a side of the first (vapor phase) CZTS(S,Se) layer opposite the substrate according to an embodiment of the present invention.

Referring back now to FIG. 2, the next phase in the present hybrid approach is to form a solution phase CZTS (S,Se) layer on the (vapor phase) CZTS(S,Se) layer 104. Specifically, as shown in FIG. 2, a (solution phase) CZTS (S,Se) layer 202 is formed on a side of the CZTS(S,Se) layer 104 opposite the substrate 102. As provided above, CZTS (S,Se) layer 104 may also be referred to herein as a first CZTS(S,Se) material/layer, and CZTS(S,Se) layer 202 may also be referred to herein as a second CZTS(S,Se) material/layer.

Generally, CZTS(S,Se) layer 202 is formed on CZTS(S, Se) layer 104 using a solution phase deposition process. According to an exemplary embodiment, the device structure (i.e., the substrate 102 with the CZTS(S,Se) layer 104 formed thereon) is removed from the vapor deposition system and placed in a nitrogen glove box. Use of a nitrogen glove box avoids exposure to oxygen and water vapor.

A casting process (such as spin-coating) is then used to deposit one or more CZTS(S,Se) precursor solutions (e.g., inks, slurries, etc.) to form CZTS(S,Se) layer 202 on CZTS (S,Se) layer 104. By way of example only, suitable inks for kesterite-type Cu—Zn—Sn—(Se,S) materials are provided in U.S. Patent Application Publication Number 2011/0094557 by Mitzi et al., entitled "Method of Forming Semiconductor Film and Photovoltaic Device Including the Film" (hereinafter "U.S. Patent Application Publication Number 2011/0094557"), the contents of which are incorporated by reference as if fully set forth herein. A suitable process for preparing and depositing (e.g., using one or more spin-coating steps with intermediate drying steps to achieve adequate coverage) a CZTSe or CZTSSe slurry are described, for example, in U.S. Pat. No. 8,765,518 issued to Teodor K. Todorov, entitled "Chalcogenide solutions," the contents of which are incorporated by reference as if fully set forth herein.

Advantageously, the resulting hybrid vapor phase-solution phase CZT(S,Se) has been found to be pinhole-free. Specifically, as highlighted above, when trying to deposit thin CZT(S,Se) films solely from the solution phase one is left with pinholes that can short or shunt the device. However, in the present hybrid device no internal pinholes are present. Thus the present hybrid process resolves the pinhole problem.

It is important to have the vapor-deposited CZTS(S,Se) layer 104 fully annealed (prior to the solution deposition phase) since partially annealed CZTS(S,Se) material may dissolve as the solution(s) (ink, slurry, etc.) is deposited thereby rendering the device inoperative. As highlighted above, by "fully annealed" it is meant that the material is fully crystallized. Further, while a solution phase deposition process for CZTS(S,Se) yields high efficiency devices, some notable drawbacks however include pinhole formation in the resulting material and that the solvents used for solution deposition (such as hydrazine) undesirably degrade oxide materials. For instance, the inks provided in U.S. Patent Application Publication Number 2011/0094557 contain hydrazine. Any oxide material(s) exposed during the deposition of the inks would undesirably be reduced by the hydrazine rendering them ineffective. Advantageously, the vapor phase CZTS(S,Se) layer 104 acts as a barrier layer protecting any underlying oxide materials during the solution deposition phase.

According to an exemplary embodiment, the present techniques are employed to form thin devices wherein CZTS(S,Se) layer 104 and CZTS(S,Se) layer 202 combined have a sub-micrometer thickness (i.e., less than 1 micrometer). Specifically, the combined thickness of CZTS(S,Se) 104 and CZTS(S,Se) layer 202 in this example is preferably from about 100 nm to about 800 nm, and ranges therebetween. Accordingly, since CZTS(S,Se) layer 104 can have a thickness of from about 50 nm to about 300 nm, and ranges therebetween, e.g., from about 100 nm to about 300 nm, then CZTS(S,Se) layer 202 would, in that case, preferably have a thickness of from about 50 nm to about 500 nm, and ranges therebetween, e.g., from about 100 nm to about 500 nm, and ranges therebetween. As provided above, contact engineering (using high work function back contacts) in conjunction with a sub-micrometer CZTS(S,Se) thick absorber can be used to increase Voc.

In accordance with the present techniques, the CZTS(S, Se) layer 104 serves as a seed layer for CZTS(S,Se) layer 202. Specifically, following deposition of CZTS(S,Se) layer 202 on CZTS(S,Se) layer 104, the two-layered stack is annealed to fully crystallize the CZTS(S,Se) layer 202. According to an exemplary embodiment, the anneal is performed at a temperature of greater than about 500° C., e.g., from about 550° C. to about 650° C., and ranges therebetween. Following this anneal, there are no structural barriers between CZTS(S,Se) layer 104 and CZTS(S,Se) layer 202. For instance, in cross-sectional images of the hybrid material one cannot see any hint of an "interface" between the vapor phase and solution phase layers. See, for example, FIG. 7—described below.

The stack may be complete with the two layers, i.e., CZTS(S,Se) layer 104 and CZTS(S,Se) layer 202. Optionally, however, one or more additional vapor phase and/or solution phase CZTS(S,Se) layers may be formed on the stack if so desired. Adding additional layers to the stack may be done, for example, in order to control the concentration profile of the material. For instance, regulating the S to Se ratio in CZTS(S,Se) absorber materials is important in terms of band gap tuning and/or band gap grading. See, for example, U.S. patent Ser. No. 14/499,116, by Mahajan et al., entitled "Anneal Techniques for Chalcogenide Semiconductors," the contents of which are incorporated by reference as if fully set forth herein. Thus, by way of example only, a three-layer stack can be formed consisting of vapor phase/ solution phase/vapor phase CZTS(S,Se) layers wherein the S to Se ratio is varied between the vapor phase and the solution phase layers to achieve an oscillatory concentration profile throughout the stack. For example, the vapor phase layer(s) in the (two-, three-, etc.) layer stack can be configured to be either a full S CZTS(S,Se) layer (i.e., no Se— a.k.a. "Se-free") or a full Se CZTS(S,Se) layer (i.e., no S—a.k.a. "S-free"), while the solution phase layer(s) in the (two-, three-, etc.) layer stack can be configured to have both S and Se—or vice versa—thereby forming an oscillatory (S,Se) concentration profile throughout the stack (see FIG. 3A). Alternatively, one of the vapor phase or solution phase layers in the (two-, three-, etc.) layer stack can be configured to have both S and Se while another vapor phase or solution phase layer(s) in the (two-, three-, etc.) layer stack is configured to be either a full S CZTS(S,Se) layer (i.e., no Se—a.k.a. "Se-free") or a full Se CZTS(S,Se) layer (i.e., no S—a.k.a. "S-free")—or vice versa—thereby also forming an oscillatory (S,Se) concentration profile throughout the stack (see FIG. 3B). It is notable that the process described above would be implemented in the same manner to form one or more additional layers on the stack.

Figure 3B:
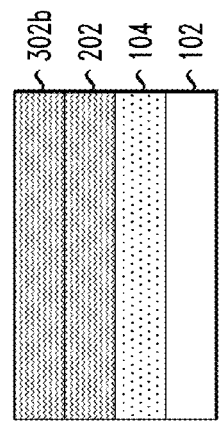
FIG. 3B is a cross-sectional diagram illustrating (optionally) forming one or more additional CZTS(S,Se) layers—in this example an additional solution phase CZTS(S,Se) layer—and how a concentration profile of the resulting CZTS(S,Se) stack can be tailored based on a composition of the layers according to an embodiment of the present invention.
Figure 3A:
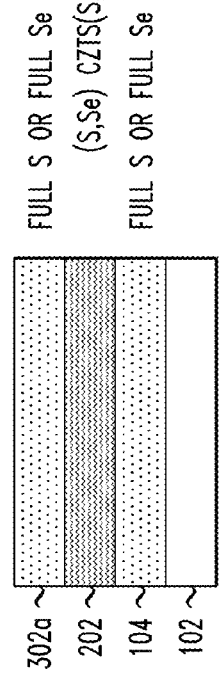
FIG. 3A is a cross-sectional diagram illustrating (optionally) forming one or more additional CZTS(S,Se) layers—in this example an additional vapor phase CZTS(S,Se) layer—and how a concentration profile of the resulting CZTS(S,Se) stack can be tailored based on a composition of the layers according to an embodiment of the present invention.

For illustrative purposes only, FIG. 3A depicts an exemplary configuration wherein a third CZTS(S,Se) layer—a vapor phase CZTS(S,Se) layer 302a—is formed on the stack, and FIG. 3B depicts an exemplary configuration wherein a third CZTS(S,Se) layer—a solution phase CZTS (S,Se) layer 302b—is formed on the stack. The result in either case is a three-layer CZTS(S,Se) stack. CZTS(S,Se) layer 302a or CZTS(S,Se) layer 302b is formed on a side of CZTS(S,Se) layer 202 opposite CZTS(S,Se) layer 104 in the same manner as described above for the vapor or solution phase deposition of CZTS(S,Se) layer 104 or CZTS(S,Se) layer 202, respectively. FIGS. 3A and 3B also illustrate how individually tuning the composition of the layers can be used to control the concentration profile of the CZTS(S,Se) material. For instance, in the examples shown in FIGS. 3A and 3B, the S to Se ratio is varied throughout the layers— such that an oscillatory (S,Se) concentration profile is achieved throughout the stack. Of course this is only an example, and one skilled in the art given the present teachings could tailor the concentration profile for a variety of different applications. Once formation of the CZTS(S,Se) stack is completed, the remaining layers/structures can be added to form a functioning device.

An exemplary implementation of the present techniques in the fabrication of a photovoltaic device is now provided by way of reference to methodology 400 of FIG. 4. For clarity, a summary of the steps included in the present techniques is provided in FIG. 4. In step 402, a substrate is provided. As described above, a variety of different substrate configurations are possible—including either single or multi-layered substrates. Advantageously, in accordance with the present techniques, the substrate can include oxide materials since the first CZTS(S,Se) layer will be deposited using a vapor phase process and will serve as a barrier layer to protect any underlying oxide materials during subsequent solution phase processes.

Optionally, in step 404 a Na precursor layer (e.g., a NaF layer) is used to dope the first CZTS(S,Se) layer (see below). Namely, when a high temperature crystallizing anneal of the first CZT(S,Se) layer is performed, Na ions from the precursor layer diffuse into and dope the first CZT(S,Se) layer. Alternatively, the Na precursor layer can be formed on top of the first CZT(S,Se) layer (see optional step 408, described below).

In step 406, the first CZTS(S,Se) layer is deposited on the substrate (or on a side of the Na precursor layer opposite the substrate, if present) using vapor phase deposition. As provided above, this vapor deposition step includes contacting the substrate with a source of Cu, a source of Zn, a source of Sn, and at least one of a source of S and a source of Se under conditions (e.g., temperature, pressure, duration, etc.) sufficient to form the first CZT(S,Se) layer on the substrate. According to an exemplary embodiment, the conditions include a temperature of from about 400° C. to about 450° C., and ranges therebetween, and a pressure of from about $1\times10^{-11}$ torr to about $1\times10^{-3}$ torr, and ranges therebetween. The vapor deposition is preferably carried out in this step for a duration that results in the first CZT(S,Se) layer being formed to a thickness of from about 50 nm to about 300 nm, and ranges therebetween, e.g., from about 100 nm to about 300 nm, and ranges therebetween, on the substrate.

An exemplary vacuum chamber-based vapor deposition system was described in detail above wherein the Cu, Zn, Sn, S and/or Se source materials are contained in separate effusion cells that can be each independently heated to control the flux. That description is incorporated by reference herein.

If Na doping is desired, and the (optional) Na precursor layer was not formed between the substrate and the first CZT(S,Se) layer in step 404, then in step 408 the (optional) Na precursor layer can alternatively be formed on top of the first CZT(S,Se) layer (i.e., on a side of the first CZT(S,Se) layer opposite the substrate). As provided above, when the high temperature crystallizing anneal of the first CZT(S,Se) layer is performed, Na ions from the precursor layer diffuse into and dope the first CZT(S,Se) layer.

Specifically, in step 410 the first CZT(S,Se) layer is then fully annealed, i.e., to fully crystallize the first CZT(S,Se) layer. According to an exemplary embodiment, the annealing in step 410 is performed at a temperature of greater than about 500° C., e.g., from about 550° C. to about 650° C., and ranges therebetween. This will yield a first CZT(S,Se) layer having grains with an average grain size of from about 1 μm to about 2 μm, and ranges therebetween—see above. As described in detail above, fully crystallizing the first CZT (S,Se) layer is important since the subsequent solution phase CZT(S,Se) deposition can undesirably dissolve any non-crystal material. If the (optional) Na precursor layer is employed (as per either step 404 or step 408, above) then it is during this high temperature crystallization anneal in step 410 that the Na ions from the precursor layer will diffuse into and dope the first CZT(S,Se) layer. Once this diffusion has taken place, the Na precursor layer is no longer present. Thus, in the next step in the process a second CZT(S,Se) layer is formed on the (in this case Na doped) first CZT(S, Se) layer.

Specifically, in step 412, the second CZT(S,Se) layer is formed on a side of the first CZT(S,Se) layer opposite the substrate using solution phase deposition. As provided above, this solution deposition step includes using a casting process (such as spin-coating) to deposit one or more CZTS(S,Se) precursor solutions (e.g., inks, slurries, etc.) to form the CZTS(S,Se) layer on the first CZTS(S,Se) layer. As described in detail above, the fully crystallized first CZTS (S,Se) layer acts as a barrier layer to protect any underlying oxide materials that are sensitive to solvents (such as hydrazine) used in the precursor solutions and/or casting process.

According to an exemplary embodiment, the combined thickness of the first CZTS(S,Se) layer and the second CZTS(S,Se) layer is from about 100 nm to about 800 nm, and ranges therebetween. Accordingly, since the first CZTS (S,Se) layer can have a thickness of from about 50 nm to about 300 nm, and ranges therebetween, e.g., from about 100 nm to about 300 nm (see above), then the second CZTS(S,Se) layer would, in that case, have a thickness of from about 50 nm to about 500 nm, and ranges therebetween, e.g., from about 100 nm to about 500 nm, and ranges therebetween. As provided above, thin devices (i.e., devices having an absorber with a thickness of less than 1 μm) enable the use of contact engineering (with high work function back contacts) to increase Voc.

The result of forming the second CZT(S,Se) layer on the first CZT(S,Se) layer is a two-layered CZT(S,Se) stack. As described in detail above (and below), one or more additional CZT(S,Se) layers (vapor phase and/or solution phase) may be formed on the stack if so desired. A motivating factor for forming additional CZT(S,Se) layers is that doing so enables further fine-tuning of the concentration profile of the CZT(S,Se) material, for example, to achieve an oscillatory concentration profile throughout the stack. Of course, if a goal is to keep the overall thickness of the CZTS(S,Se) stack less than 1 μm (e.g., from about 100 nm to about 800 nm, and ranges therebetween), then care must be taken to tailor the thickness of each of the individual layers in the stack to meet this requirement.

In step 414, the two-layered stack is fully annealed to fully crystallize the second CZTS(S,Se) layer. According to an exemplary embodiment, this anneal in step 414 is performed at a temperature of greater than about 500° C., e.g., from about 550° C. to about 650° C., and ranges therebetween. Following this anneal, there are no structural barriers between the first and second CZTS(S,Se) layers. Further, as provided above, the already-fully crystallized first CZTS(S, Se) layer acts as a seed layer for the crystallization of the second CZTS(S,Se) layer. Even if additional vapor phase and/or solution phase CZTS(S,Se) layers are to be deposited onto the stack, it is preferable to perform this anneal in step 414 prior to depositing the additional CZTS(S,Se) layers. For instance, the anneal performed in step 414 serves to bake off the remaining solvent from the solution phase deposition—without which further vapor phase deposition steps could not be performed.

Optionally, in step 416 at least one more additional (vapor phase and/or solution phase) CZTS(S,Se) layers are formed on the stack. An example illustrating an additional vapor phase CZTS(S,Se) layer having been deposited onto the stack is shown in FIG. 3A—described above, and an example illustrating an additional solution phase CZTS(S, Se) layer having been deposited onto the stack is shown in FIG. 3B—described above. However, any number and/or combination of additional vapor phase and/or solution phase CZTS(S,Se) layers may be formed on the stack using the teachings provided herein. Preferably, after the deposition of each additional layer on the stack an anneal is performed as per step 414—see FIG. 4. As provided above, this insures compatibility between the layers in the stack.

Once the CZT(S,Se) stack formation is complete, any additional processing steps may be performed to form a completed device. By way of example only, the remaining steps of methodology 400 are directed to an exemplary embodiment for forming a photovoltaic device. It is to be understood, however, that the present techniques are more broadly applicable to any application involving a CZTS(S, Se) material for which the present hybrid vapor phase-solution phase CZT(S,Se) techniques may be employed. In this example, the CZT(S,Se) layers in the stack collectively serve as an absorber material of the photovoltaic device.

In step 418, for example, a buffer layer is formed on a side of the CZT(S,Se) stack opposite the substrate. According to an exemplary embodiment, the buffer layer is formed from at least one of cadmium sulfide (CdS), a cadmium-zinc-sulfur material of the formula $Cd_{1-x}Zn_xS$ (wherein $0<x\leq1$), indium sulfide ($In_2S_3$), zinc oxide, zinc oxysulfide (e.g., a Zn(O,S) or Zn(O,S,OH) material), and aluminum oxide ($Al_2O_3$). The buffer layer may be formed on the CZT(S,Se) stack using a deposition process such as standard chemical bath deposition. According to an exemplary embodiment, the buffer layer is formed having a thickness of from about 50 angstroms (Å) to about 1,000 Å, and ranges therebetween. The buffer layer and the CZT(S,Se) absorber material form a p-n junction therebetween.

In step 420, a transparent front contact is formed on a side of the buffer layer opposite the CZT(S,Se) stack. According to an exemplary embodiment, the transparent front contact is formed from a transparent conductive oxide (TCO) such as indium-tin-oxide (ITO) and/or aluminum (Al)-doped zinc oxide (ZnO) (AZO)). The transparent front contact may be formed on the buffer layer using a deposition process such as sputtering. At this point in the process, a functioning photovoltaic device has been formed. However, additional processing may be performed and/or additional structures may be formed if so desired.

For example, in step 422 metal contacts may optionally be formed on a side of the transparent front contact opposite the buffer layer. According to an exemplary embodiment, the metal contacts are formed from aluminum (Al) and/or nickel (Ni). The metal contacts may be formed on the transparent front contact using a process such as electron-beam evaporation.

Another optional component of the device is an antireflective coating. For example, in step 424 an antireflective coating may be formed on a side of the transparent front contact opposite the buffer layer (so as to cover the metal contacts, if present). According to an exemplary embodiment, the antireflective coating is formed from magnesium oxide (MgO) or magnesium fluoride ($MgF_2$). The antireflective coating may be formed on the transparent front contact using a deposition process such as electron-beam evaporation.

Figure 5A:
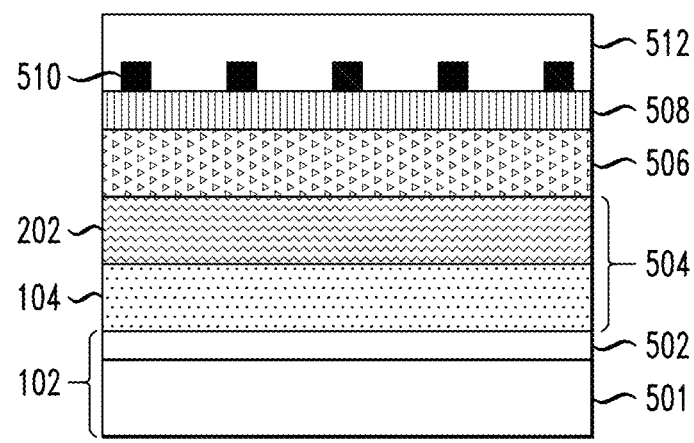
FIG. 5A is a cross-sectional diagram illustrating an exemplary photovoltaic device which may be formed, for example, using the methodology of FIG. 4 having a two-layered CZTS(S,Se) stack according to an embodiment of the present invention.

FIG. 5A is a diagram illustrating an exemplary photovoltaic device 500A which may be formed, for example, using methodology 400 of FIG. 4. The same reference numerals (and patterning) are being used to denote to the same structures throughout the figures. As shown in FIG. 5A, photovoltaic device 500A includes a substrate 102, a multilayer stack 504 of CZT(S,Se) absorber material on the substrate 102, a buffer layer 506 on a side of the multi-layer stack 504 of CZT(S,Se) absorber material opposite the substrate 102, a transparent front contact 508 on a side of the buffer layer 506 opposite the multi-layer stack 504 of CZT(S,Se) absorber material, metal contacts 510 on a side of the transparent front contact 508 opposite the buffer layer 506, and an antireflective coating 512 on a side of the transparent front contact 508 opposite the buffer layer 506 (so as to cover the metal contacts 510).

As provided above, a variety of different substrate configurations may be used in accordance with the present techniques—including substrates containing oxide materials. Namely, the vapor phase CZT(S,Se) layer formed on the substrate acts as a barrier layer to protect any underlying oxide materials from solvents (such as hydrazine) used during subsequent solution phase deposition steps. To illustrate this point, according to an exemplary embodiment, substrate 102 can include a multilayer oxide configuration wherein, for example, substrate 102 includes a transparent conductive oxide (TCO) 501, such as ITO or FTO, coated with an oxide layer 502 containing ZnO, ZnOS and/or ZnSnO. Alternatively, substrate 102 can include soda lime glass 501 coated with a conductive layer 502 of Mo.

In the exemplary embodiment shown in FIG. 5A, the multi-layer stack 504 of CZT(S,Se) absorber material is a two-layered stack including a first (vapor phase) CZT(S,Se) layer 104 and a second (solution phase) CZT(S,Se) layer 202. However, as provided above, embodiments are anticipated herein where at least one additional vapor phase and/or solution phase CZT(S,Se) layer is also present in the stack. See, for example, FIGS. 5B and 5C, below.

As provided above, the buffer layer 506 may be formed from at least one of CdS, a cadmium-zinc-sulfur material of the formula $Cd_{1-x}Zn_xS$ (wherein $0<x\leq1$), $In_2S_3$, zinc oxide, zinc oxysulfide (e.g., a Zn(O,S) or Zn(O,S,OH) material), and $Al_2O_3$. The transparent front contact 508 may be formed from a TCO such as ITO and/or Al-doped ZnO (AZO). The metal contacts 510 may be formed from Al and/or Ni. The antireflective coating 512 may be formed from MgO or $MgF_2$.

Figure 5B:
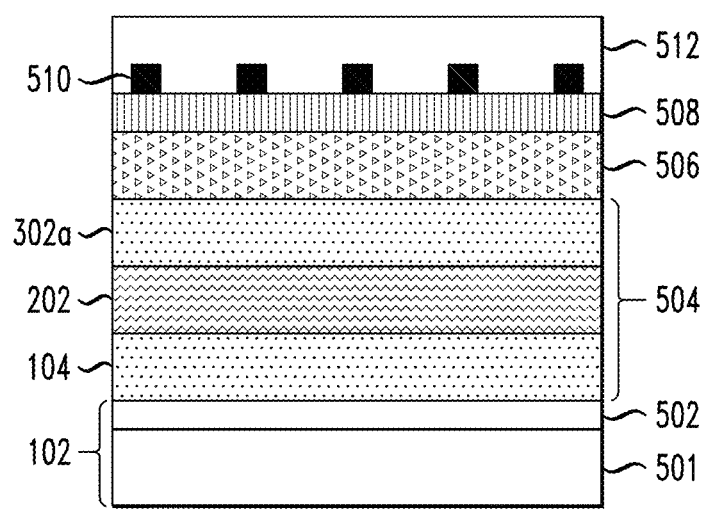
FIG. 5B is a cross-sectional diagram illustrating an exemplary photovoltaic device which may be formed, for example, using the methodology of FIG. 4 having a three-layered CZTS(S,Se) stack according to an embodiment of the present invention.
Figure 5C:
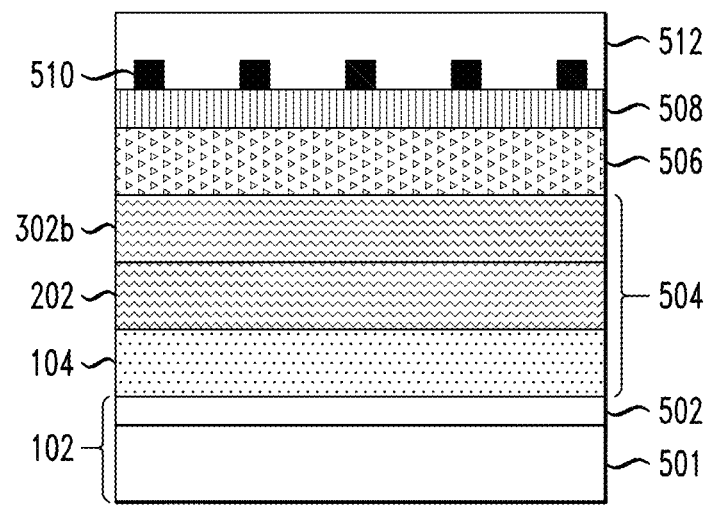
FIG. 5C is a cross-sectional diagram illustrating another exemplary photovoltaic device which may be formed, for example, using the methodology of FIG. 4 having a three-layered CZTS(S,Se) stack according to an embodiment of the present invention.

For completeness, FIGS. 5B and 5C are provided which illustrate the same photovoltaic device structure as FIG. 5A except that an additional vapor or solution phase CZT(S,Se) layer is present in (this case a three-layered) stack. Specifically, in the photovoltaic device 500B shown in FIG. 5B, the multi-layer stack 504 of CZT(S,Se) absorber material is a three-layered stack including a first (vapor phase) CZT(S,Se) layer 104, a second (solution phase) CZT(S,Se) layer 202, and a third (vapor phase) CZT(S,Se) layer 302a. In the photovoltaic device 500C shown in FIG. 5C, the multi-layer stack 504 of CZT(S,Se) absorber material is a three-layered stack including a first (vapor phase) CZT(S,Se) layer 104, a second (solution phase) CZT(S,Se) layer 202, and a third (solution phase) CZT(S,Se) layer 302b. As above, the same reference numerals (and patterning) are being used to denote to the same structures throughout the figures.

Figure 7:
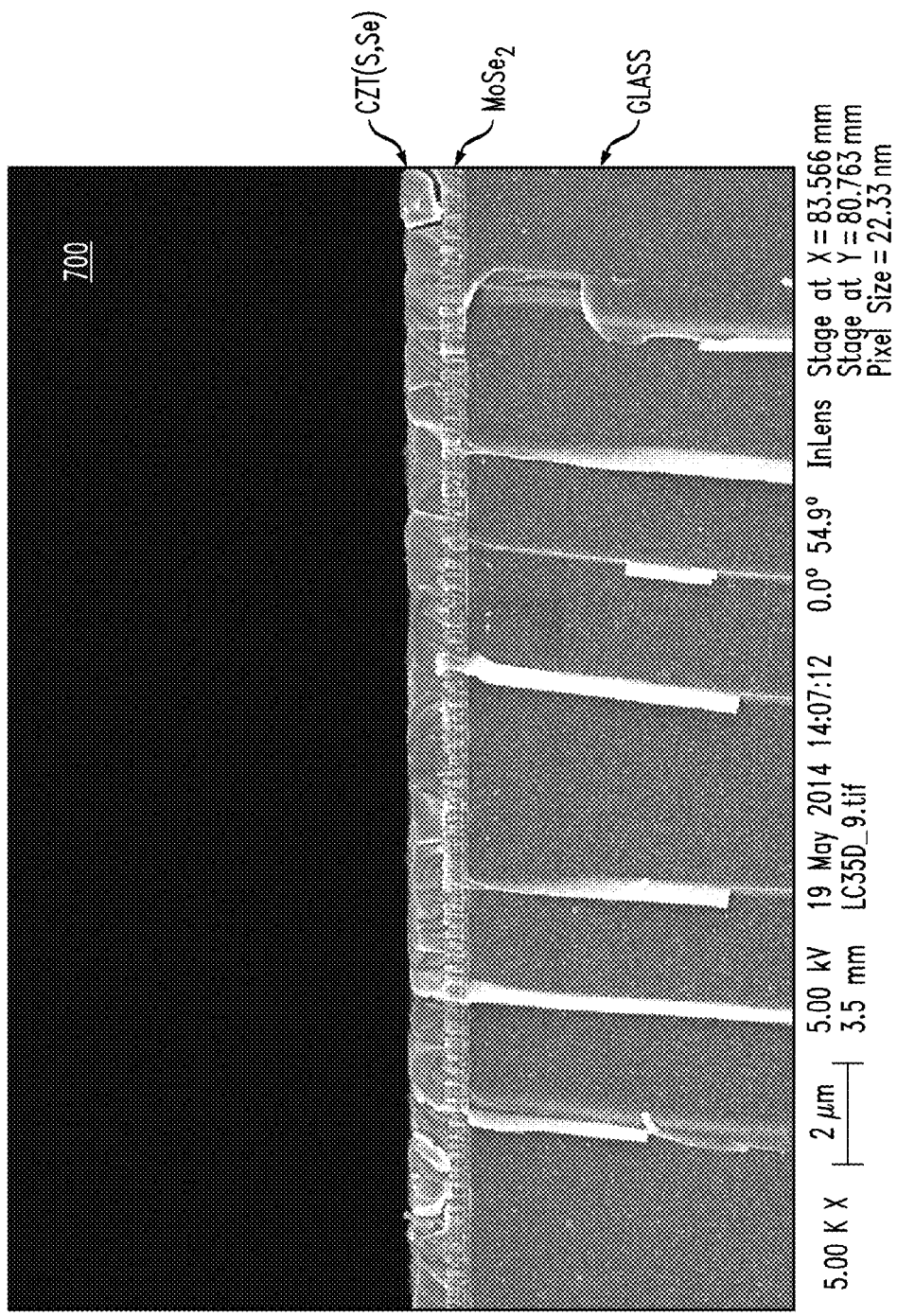
FIG. 7 is a scanning electron micrograph (SEM) image of a two-layered stack of CZT(S,Se) formed using the present hybrid vapor phase-solution phase CZT(S,Se) techniques according to an embodiment of the present invention.

FIG. 7 is a scanning electron micrograph (SEM) image 700 of a two-layered stack of CZT(S,Se) formed using the present hybrid vapor phase-solution phase CZT(S,Se) techniques on a Mo-coated substrate. It is notable from SEM image 700 that the hybrid deposited material exhibits virtually no voiding at the Mo/CZT(S,Se) interface and shows large single grains that span the width of the film. It is also notable that there is no observable interface between the vapor and solution phase grown layers.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming a kesterite absorber material on a substrate, the method comprising the steps of:
    depositing a continuous layer of a first kesterite material on the substrate using a vapor phase deposition process, wherein the first kesterite material comprises copper (Cu), zinc (Zn), tin (Sn), and at least one of sulfur (S) and selenium (Se), wherein the substrate is an oxide material, and wherein the first kesterite material is deposited directly onto the oxide material;
    annealing the first kesterite material to fully crystallize the first kesterite material such that each grain of the first kesterite material is crystalline, and wherein the first kesterite material, when fully crystallized, forms a protective layer on the oxide material; and
    depositing a layer of a second kesterite material on a side of the first kesterite material opposite the substrate using a solution phase deposition process, wherein the second kesterite material comprises Cu, Zn, Sn, and at least one of S and Se,
    wherein the first kesterite material and the second kesterite material form a multi-layer stack of the absorber material on the substrate.

2. The method of claim 1, wherein the step of depositing the layer of the first kesterite material on the substrate using a vapor phase deposition process comprises the step of:
    contacting the substrate with a Cu source, a Zn source, a Sn source, and at least one of a S source and a Se source under conditions sufficient to form the first kesterite material on the substrate.

3. The method of claim 2, wherein the conditions comprise a temperature of from about 400° C. to about 450° C., and a pressure of from about $1\times10^{-11}$ torr to about $1\times10^{-3}$ torr.

4. The method of claim 1, wherein the layer of the first kesterite material is formed having a thickness of from about 100 nm to about 300 nm.

5. The method of claim 1, wherein the first kesterite material is annealed at a temperature of greater than about 500° C. to crystallize the first kesterite material.

6. The method of claim 1, wherein the first kesterite material is annealed at a temperature of from about 550° C. to about 650° C. to crystallize the first kesterite material.

7. The method of claim 1, wherein the first kesterite material, once crystallized, has an average grain size of from about 1 μm to about 2 μm.

8. The method of claim 1, further comprising the step of:
    doping the first kesterite material with Na by depositing a Na precursor layer on the first kesterite material, and wherein by way of the step of annealing the first kesterite material Na ions from the Na precursor layer diffuse into and dope the first kesterite material.

9. The method of claim 1, wherein the step of depositing the layer of the second kesterite material on the side of the first kesterite material opposite the substrate using a solution phase deposition process comprises the step of:
    depositing one or more precursor solutions onto the first kesterite material using a spin-coating process, wherein the precursor solutions comprise hydrazine.

10. The method of claim 1, wherein the layer of the second kesterite material is formed having a thickness of from about 100 nm to about 500 nm.

11. The method of claim 1, further comprising the step of:
    annealing the multi-layer stack of the absorber material at a temperature of from about 550° C. to about 650° C.

12. The method of claim 1, further comprising the step of:
    depositing at least one layer of a third kesterite material on the multi-layer stack of the absorber material using either the vapor phase deposition process or the solution phase deposition process, wherein the third kesterite material comprises Cu, Zn, Sn, and at least one of S and Se.

13. The method of claim 1, wherein the oxide material is selected from the group consisting of: zinc oxide, zinc oxysulfate, zinc tin oxide, and combinations thereof.

14. A method of forming a photovoltaic device, the method comprising the steps of:

depositing a continuous layer of a first kesterite material on a substrate using a vapor phase deposition process, wherein the first kesterite material comprises Cu, Zn, Sn, and at least one of S and Se, wherein the substrate is an oxide material, and wherein the first kesterite material is deposited directly onto the oxide material;

annealing the first kesterite material to fully crystallize the first kesterite material such that each grain of the first kesterite material is crystalline, and wherein the first kesterite material, when fully crystallized, forms a protective layer on the oxide material;

depositing a layer of a second kesterite material on a side of the first kesterite material opposite the substrate using a solution phase deposition process, wherein the second kesterite material comprises Cu, Zn, Sn, and at least one of S and Se, and wherein the first kesterite material and the second kesterite material form a multi-layer stack of an absorber material on the substrate;

forming a buffer layer on a side of the multi-layer stack of the absorber material opposite the substrate; and forming a transparent front contact on a side of the buffer layer opposite the multi-layer stack of the absorber material.

15. The method of claim 14, further comprising the steps of:

forming metal contacts on a side of the transparent front contact opposite the buffer layer; and forming an antireflective coating on the transparent front contact covering the metal contacts.

16. The method of claim 14, further comprising the step of:

depositing at least one layer of a third kesterite material on the multi-layer stack of the absorber material using either the vapor phase deposition process or the solution phase deposition process, wherein the third kesterite material comprises Cu, Zn, Sn, and at least one of S and Se.

* * * * *